(12) United States Patent
Uchiumi et al.

(10) Patent No.: US 8,939,631 B2
(45) Date of Patent: Jan. 27, 2015

(54) CONTROLLING DEVICE WITH AN INSULATING PORTION

(75) Inventors: Noriya Uchiumi, Tokyo (JP); Hidefumi Harada, Tokyo (JP); Hiroshi Koga, Tokyo (JP)

(73) Assignee: Azbil Corporation, Tokyo (JP)

( * ) Notice: Subject to any disclaimer, the term of this patent is extended or adjusted under 35 U.S.C. 154(b) by 380 days.

(21) Appl. No.: 13/390,990

(22) PCT Filed: Aug. 25, 2010

(86) PCT No.: PCT/JP2010/005222
§ 371 (c)(1),
(2), (4) Date: Feb. 17, 2012

(87) PCT Pub. No.: WO2011/030511
PCT Pub. Date: Mar. 17, 2011

(65) Prior Publication Data
US 2012/0155117 A1    Jun. 21, 2012

(30) Foreign Application Priority Data
Sep. 11, 2009  (JP) .................................. 2009-21637

(51) Int. Cl.
*F21V 7/04*   (2006.01)
*H05K 9/00*   (2006.01)

(52) U.S. Cl.
CPC .................................. *H05K 9/0067* (2013.01)
USPC ............................ 362/611; 362/633; 362/634

(58) Field of Classification Search
USPC .................................. 362/611, 623, 633, 634
See application file for complete search history.

(56) References Cited

U.S. PATENT DOCUMENTS

| | | | |
|---|---|---|---|
| 6,404,622 B1 | 6/2002 | Chen | |
| 6,587,166 B1 | 7/2003 | Lee et al. | |
| 8,285,335 B2 | 10/2012 | Seo et al. | |

FOREIGN PATENT DOCUMENTS

| | | |
|---|---|---|
| CN | 201097040 | 8/2008 |
| JP | 1-64900 U | 4/1989 |
| JP | 6-286307 A | 10/1994 |
| JP | 2005-158579 A | 6/2005 |
| KR | 10-2009-0035200 A | 4/2009 |
| KR | 10-2009-0066857 A | 6/2009 |
| TW | 522353 B | 3/2003 |
| TW | I301569 B | 10/2008 |
| TW | 201038168 A | 10/2010 |

OTHER PUBLICATIONS

D-Link Cloud product page dated May 7, 2010, DAP-1350 wireless router, available: http://www.wretch.cc/blog/dlinktwblog/10342612.

(Continued)

*Primary Examiner* — Joseph L Williams
(74) *Attorney, Agent, or Firm* — Troutman Sanders LLP

(57) ABSTRACT

A control apparatus is provided with a substrate disposed inside a main case and on which light sources are mounted. A surface panel in which light-source display windows are formed at positions opposite the light sources, is also disposed in the main case. The outer rim of the surface of the surface panel facing the main case is affixed to the front-surface rim of the main case with an insulating part sandwiched therebetween.

5 Claims, 4 Drawing Sheets

(56) References Cited

OTHER PUBLICATIONS

Taiwanese Office Action and Search Report dated Jun. 20, 2013, which issued during the prosecution of Taiwanese Patent Application No. 099145732.

Taiwanese Office Action and Search Report, dated Sep. 23, 2013, which issued during the prosecution of Taiwanese Patent Application No. 099145732.

Korean Office Action, dated Dec. 21, 2012, which issued during the prosecution of Korean Patent Application No. 10-2011-7029813, which corresponds to the present application.

Chinese Office Action dated Mar. 24, 2014, from corresponding Chinese Application No. 201080039392.2.

CONTROLLING DEVICE WITH AN INSULATING PORTION

CROSS REFERENCE TO PRIOR APPLICATIONS

This application is a U.S. National Phase application under 35 U.S.C. §371 of International Application No. PCT/JP2010/005222, filed on Aug. 25, 2010 and claims benefit of priority to Japanese Patent Application No. 2009-210637, filed on Sep. 11, 2009. The International Application was published in Japanese on Mar. 17, 2011 as WO 2011/030511 A1 under PCT Article 21(2). All of these applications are herein incorporated by reference.

FIELD OF TECHNOLOGY

The present invention relates to a controlling device wherein the operating status of the device itself is displayed on a front panel through, for example, turning ON/OFF a light source that is mounted on a circuit board that is disposed therein.

BACKGROUND

A conventional controlling device 100, as illustrated in FIGS. 3(a) and 3(b), has, within a main unit case 101, a circuit board 102 on which is mounted a light source 102a, such as an LED (light emitting diode) that is turned ON in response to a specific operation of the controlling device 100. Moreover, on the front side of the main unit case 101, a front panel 103 is provided wherein a light source displaying window 103a, for displaying the operating status, or the like, of the controlling device 100, is positioned facing the light source 102a. The controlling device 100 that is configured in this way makes it possible for an operator to confirm visually, through the light source displaying window 103a, the current operating state of the controlling device 100, through turning ON/OFF a corresponding light source 102a in accordance with the operating state.

As illustrated in FIG. 3 (b), this conventional controlling device 100 is structured with two stepped frame portions 101a and 101b formed in the inner wall of the main unit case 101, where the circuit board 102 is disposed in the rear stepped frame portion 101a of the main unit case 101, and the front panel 103 is fitted into the front stepped frame portion 101b of the main unit case 101.

If here the color of the controlling device 100 is uniformly black, then the front panel 103 can be given a black color through silk screen printing black ink on the back face of the translucent plastic. However, usually black ink includes carbon, and thus there is a danger that when the user touches the connecting part between the main unit case 101 and the front panel 103 that static electricity will flow through the black ink that is printed on the front panel 103 into the circuit board 102 that is disposed within the main unit case 101.

Given this, as countermeasures for static electricity in the conventional controlling device 100, as illustrated in FIG. 4, a circuit board 102, having a conductive layer 105 formed through printing carbon ink onto the surface thereof, is disposed on the back face side of the front panel 103 that has an operating key 104, and this electrically conductive layer 105 is connected through a supporting plate 106 to a bracket (ground member) 107 that is disposed within the controlling device 100, so that when the user operates the operating key 104 any static electricity charged in the user will flow from the electrically conductive layer 105 to the ground member 107, structured so as to protect, from the static electricity, the electrical circuitry such as the control circuits, and the like, that are provided within the controlling device 100 (See, for example, Japanese Unexamined Patent Application Publication 2005-158579 ("JP '579")).

However, the controlling device 100 disclosed in JP '579 requires the provision of the ground member 107, and when used in a small controlling device there is a problem in that it is not possible to secure space for the positioning of the ground member 107, and a problem in that the structure is complex if a ground member 107 is used.

Additionally, in the conventional controlling device 100, the structure is one wherein two stepped frame portions 101a and 101b are provided within the main unit case 101, to secure the circuit board 102 and the front panel 103, and thus the size of the circuit board 102 must be small, and there is a problem in terms of constraints on the design due to the limitation of the space for the positioning of the light source displaying windows 103a, which is formed facing the position of the light source 102a that is mounted on the circuit board 102 to being toward the interior of the front panel 103.

SUMMARY

The present invention is to solve problems such as set forth above, and the object thereof is to provide a controlling device able to protect the circuit board within the controlling device from static electricity, wherein there is freedom in the design through an increase in the space wherein the light source displaying windows can be positioned in the front panel.

The controlling device according to examples of the present invention is disposed within a main unit case, and includes a circuit board, where light sources are mounted, and a front panel wherein light source displaying windows are formed at positions that face the light sources, wherein: the outer peripheral edge portion of the face of the front panel that faces the main unit case is secured to a front face edge portion of the main unit case through an insulating portion.

Examples of the present invention, given the structure set forth above, makes it possible to protect a circuit board within the controlling device from static electricity, and makes it possible to increase the space for the positioning of the light source displaying windows in the front panel, enabling freedom in design.

DETAILED DESCRIPTION

An example of the present invention is explained in detail below referencing the figures.

Figure 1:
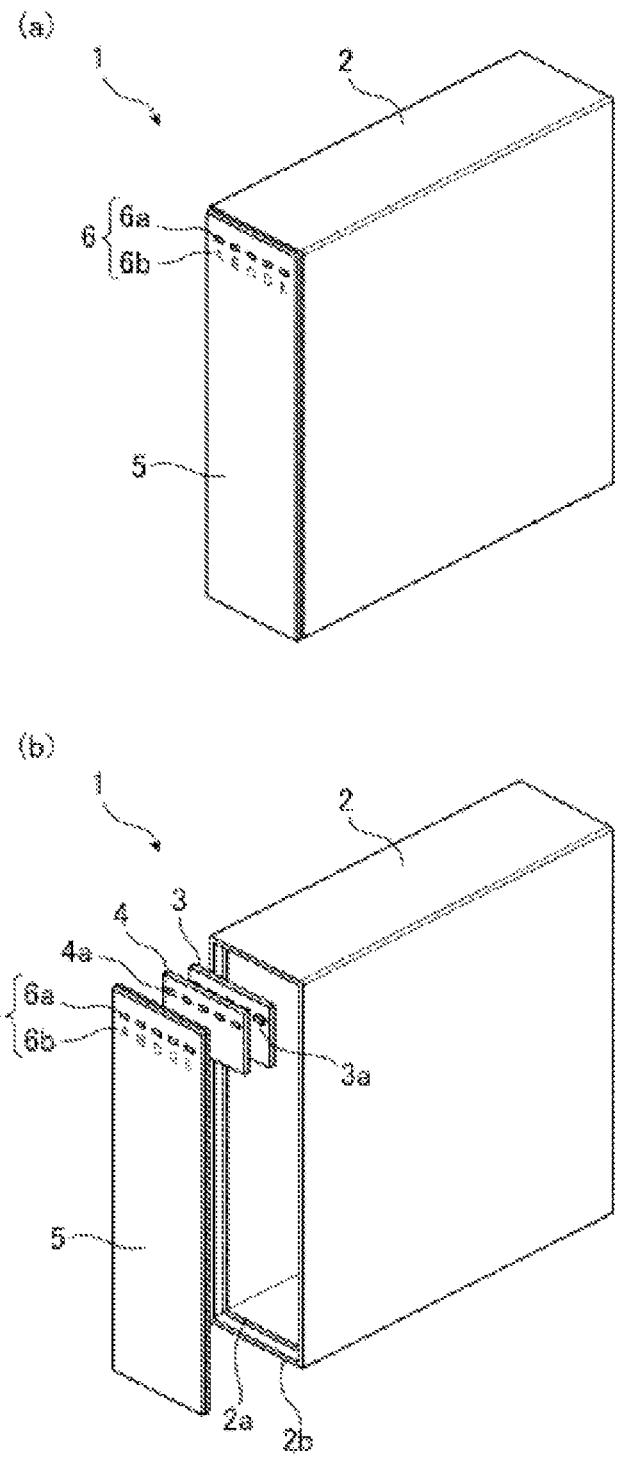
FIGS. 1(a) and 1(b) are diagrams illustrating the structure of a controlling device according to an example of the present invention.
Figure 2:
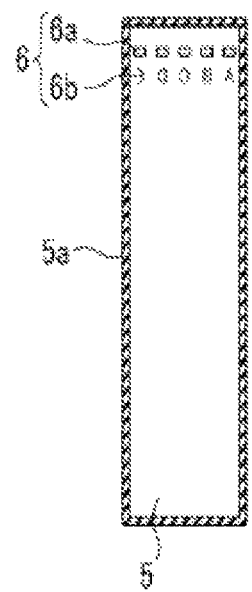
FIG. 2 is a diagram illustrating the back face of the front panel in the example.
Figure 3:
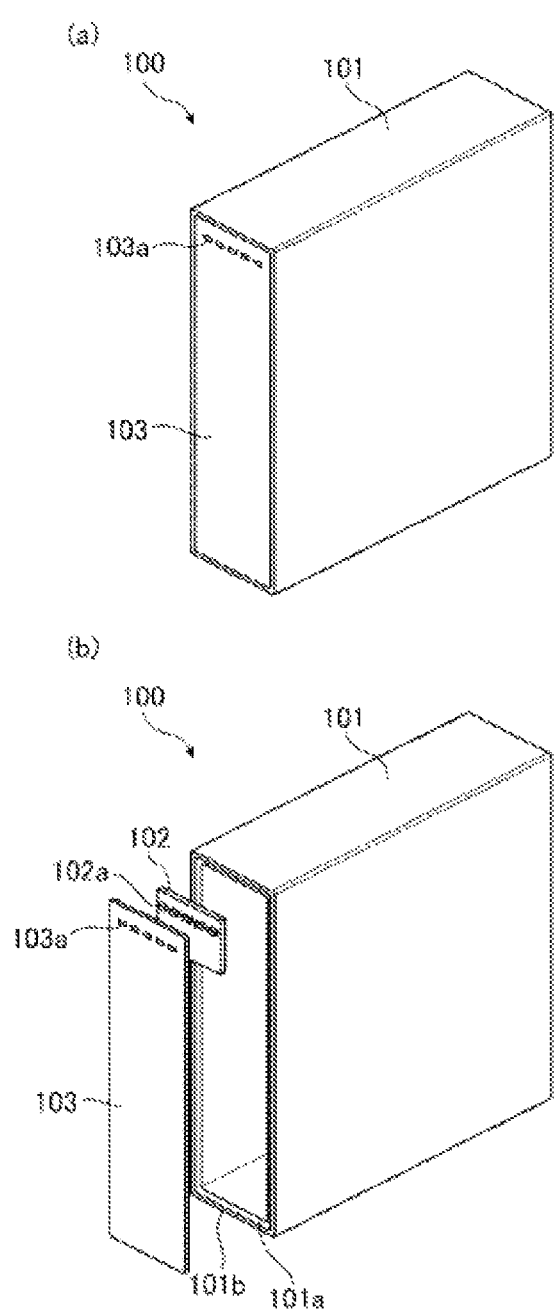
FIG. 3 is a diagram illustrating the structure of a conventional controlling device.
Figure 4:
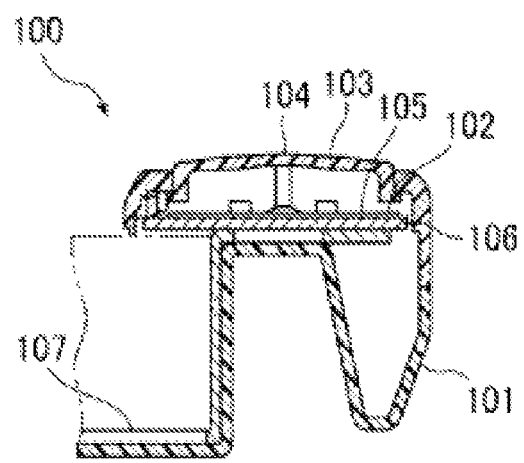
FIG. 4 is a diagram illustrating another structure of a conventional controlling device.

FIG. 1 is a diagram illustrating the structure of a controlling device 1 according to a first form of embodiment according to the present invention, wherein FIG. 1 (a) is a perspective diagram and FIG. 1 (b) is an assembly perspective diagram. Additionally, FIG. 2 is a diagram illustrating the back face of the front panel in the example according to the present invention. As illustrated in FIG. 1, the controlling device 1 is structured from a main unit case 2, a circuit board 3, a light guiding part 4, and a front panel 5. Note that the color of the controlling device 1 is uniformly black.

The main unit case 2 is a case for containing, in the interior thereof, a circuit board 3, a light guiding part 4, and control circuitry, and the like, not shown, and is structured from black plastic that is formed into a box shape, having an opening on the front face. A single stepped frame portion 2a, for the provision of the circuit board 3, is formed in the inner wall of the front face side of the main unit case 2. Moreover, a front face edge portion 2b, for securing the front panel 5, is formed on the front face of this main unit case 2.

The circuit board 3 is for turning ON the corresponding LEDs (light sources) 3a in accordance with the operating status of the controlling device 1, and a plurality of LEDs 3a are mounted thereon. This circuit board 3 is disposed in the stepped frame portion 2a that is formed in the main unit case 2.

The light guiding part 4 is for guiding, to the front panel 5, the light from the LEDs 3a that are mounted on the circuit board 3. In this light guiding part 4, opening portions 4a are formed at positions facing the LEDs 3a that are mounted on the circuit board 3. Moreover, base material of the light guiding part 4 in the lettering portions 6b formed in the displaying portion 6 of the front panel 5, described below, are translucent, so the light guiding part 4 is structured from a plastic of a color that is desired for the lettering portions 6b. This light guiding part 4 is disposed on the front face side of the circuit board 3.

The front panel 5 is formed from translucent plastic, and, as illustrated in FIG. 2, is, overall, colored black through the insulating portion 5a be formed through silk screening a non-carbon black ink (IR black), which is an insulating ink, on the outer peripheral edge portion of the face (the back face) that faces the main unit case 2, and silk screening black ink towards the interior thereof. The front panel 5 is secured, by an adhesive, or the like, to the front face edge portion 2b of the main unit case 2.

Moreover, the front panel 5 has a displaying portion for displaying the operating status, or the like, of the controlling device 1. In this displaying portion 6, the ink that is printed at positions facing the LEDs 3a that are mounted on the circuit board 3 that is disposed on the back face side thereof is stripped by a laser marker, or the like, so as to produce translucency, to form LED displaying windows (tight source displaying windows) 6a by which the ON/OFF states of the LEDs 3a can be seen. Moreover, by using the laser marker to strip the ink into specific lettering shapes in the displaying portion 6, lettering portions 6b are formed wherein the base material of the light guiding part 4 that is disposed on the back face side is caused to be translucent.

Here, when forming the LED displaying windows 6a, a range wherein the ink is stripped by the laser marker, or a dot pattern through adjusting the intensity, is formed. This control of the laser marker makes it possible to apply a diffusing effect or smoky effect to the LED displaying windows 6a. Doing so eliminates the need for a smoky plate that has been used conventionally when applying a diffusing effect and smoky effect to the LED displaying windows 6a, and eliminates the need for a process for applying the smoky plate, making it possible to reduce the component cost.

In this way, printing an insulating ink on the outer peripheral edge portions of the face of the front panel 5 that faces the main unit case 2, to form the insulating portion 5a, makes it possible to prevent the flow of the static electricity into the circuit board 3 that is contained within the main unit case 2 when the user has touched, with a hand, the connecting portion between the controlling device 1 and the front panel 5.

Moreover, having only a single stepped frame portion 2a formed in the inner wall of the main unit case 2 and disposing the circuit board 3 in this stepped frame portion 2a to secure the front panel 5 to the front face edge portion 2b of the main unit case 2 makes it possible to increase the size of the circuit board 3, making it possible to increase the space for the positioning, on the front panel 5, of the LED displaying windows 6a that are formed at positions facing the LEDs 3a that are mounted on the circuit board 3, thus reducing the design constraints, enabling freedom in design.

Additionally, in the displaying portion 6 of the front panel 5, the ink in specific portions is stripped by the laser marker to form LED displaying windows 6a through which the ON/OFF state of the LEDs 3a can be seen, and to form lettering portions 6b wherein the base material of the light guiding part 4 is translucent, thus making it possible to produce a variety of different displays easily through eliminating the need for different printing plates for each model, as have been used conventionally, when there are differences in the positions or numbers of LED displaying windows 6a, or differences in the lettering of the lettering portions 6b depending on the model, thus making it possible to increase the size of ordering lots through combining the orders of the individual lots. Moreover, because of this structure wherein the base material of the light guiding part 4 is translucent, the color of the lettering of the lettering portions 6b can be changed easily by changing the color of the light guiding part 4.

As described above, in the example, structuring so that an insulating portion 5a is formed on the outer peripheral edge portion of the face of the front panel 5 that faces the main unit case 2 and so that the front panel 5 is secured to the front face edge portion 2b of the main unit case 2 makes it possible to prevent the flow of static electricity into the circuit board 3 that is contained in the inner portion of the main unit case 2 when the operator touches a hand to the connecting portion between the main unit case 2 and the front panel 5, and makes it possible to increase the size of the circuit board 3 on which the LEDs 3a are mounted, disposed within the main unit case 2, thus making it possible to increase the space for the positioning on the front panel 5 of the LED displaying windows 6a that are formed at positions facing the LEDs 3a, thus enabling freedom in design.

While the formation of an insulating portion 5a on the outer peripheral edge portion of the front panel 5 that faces the main unit case 2 was explained in the controlling device 1 according to the example, instead the insulating portion 5a may be formed on the front face edge portion 2b of the main unit case 2.

Note that the various examples can be combined freely or modified within the scope of the spirit and intent of the present invention.

An insulating front panel according to example of the present invention makes it possible to protect, from static electricity, the circuit board within the controlling device, and enables an increase in the space for positioning of the light source displaying windows on the front panel, thereby enabling freedom in design, and thus can be used in controlling devices, and the like, wherein the operating status of the equipment main unit is displayed on the front panel thereof through turning ON/OFF light sources that are mounted on a circuit board that is disposed in the interior thereof.

The invention claimed is:

1. A controlling device disposed within a main unit case, comprising:

a circuit board;
a light source mounted to the circuit board;
a front panel;
a light source displaying window provided in the front panel at a position that faces the light source; and
an insulating portion, wherein
an outer peripheral edge portion of a face of the front panel that faces the main unit case is secured to a front face edge portion of the main unit case through the insulating portion, and
the insulating portion has an insulating ink and is provided by printing on either the outer peripheral edge portion of the face of the front panel that faces the main unit case or on the front face edge portion of the main unit case.

2. A controlling device disposed within a main unit case, comprising:
a circuit board;
a light source mounted to the circuit board;
a front panel;
a light source displaying window provided in the front panel at a position that faces the light source; and
an insulating portion, wherein
an outer peripheral edge portion of a face of the front panel that faces the main unit case is secured to a front face edge portion of the main unit case through the insulating portion, and
the insulating portion has a non-carbon black ink and is provided by printing on either the outer peripheral edge portion of the face of the front panel that faces the main unit case or on the front face edge portion of the main unit case.

3. A controlling device disposed within a main unit case, comprising:
a circuit board;
a light source mounted to the circuit board;
a front panel;
a light source displaying window provided in the front panel at a position that faces the light source; and
an insulating portion, wherein
an outer peripheral edge portion of a face of the front panel that faces the main unit case is secured to a front face edge portion of the main unit case through the insulating portion,
a light guiding part guiding, to the light source displaying window formed in the front panel, light from the light source, is provided between the circuit board and the front panel,
in the front panel, ink that is printed on the face that faces the light source is stripped in a particular shape by a laser marker and is provided with a lettering portion, and
the base material of the light guiding part is translucent.

4. A controlling device disposed within a main unit case, comprising:
a circuit board;
a light source mounted to the circuit board;
a front panel;
a light source displaying window provided in the front panel at a position that faces the light source; and
an insulating portion, wherein
an outer peripheral edge portion of a face of the front panel that faces the main unit case is secured to a front face edge portion of the main unit case through the insulating portion,
the front panel has a portion printed with an ink at a position facing the light source,
the portion printed with the ink has a stripped portion where the ink is stripped by the laser marker, and
the stripped portion is the light source displaying window.

5. The controlling device as set forth in claim 4, wherein:
the light source displaying window is provided in a dot pattern.

* * * * *

UNITED STATES PATENT AND TRADEMARK OFFICE
CERTIFICATE OF CORRECTION

PATENT NO. : 8,939,631 B2  
APPLICATION NO. : 13/390990  
DATED : January 27, 2015  
INVENTOR(S) : Noriya Uchiumi et al.

Page 1 of 1

It is certified that error appears in the above-identified patent and that said Letters Patent is hereby corrected as shown below:

Title Page, Item (30), delete "2009-21637", add "2009-210637"

Signed and Sealed this  
Twenty-sixth Day of May, 2015

Michelle K. Lee  
*Director of the United States Patent and Trademark Office*